(12) United States Patent
Fu et al.

(10) Patent No.: US 6,184,122 B1
(45) Date of Patent: Feb. 6, 2001

(54) METHOD FOR PREVENTING CROSSTALK BETWEEN CONDUCTIVE LAYERS

(75) Inventors: Kuan-Yu Fu; Shiang Huang-Lu, both of Hsinchu (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/213,197

(22) Filed: Dec. 17, 1998

(51) Int. Cl.⁷ ................................................ H01L 21/4763
(52) U.S. Cl. .......................... 438/622; 438/618; 438/761
(58) Field of Search ..................................... 438/622, 618, 438/619, 623, 667, 675, 620, 761

(56) References Cited

U.S. PATENT DOCUMENTS 6,060,383 * 5/2000 Nogami et al. ...................... 438/622

* cited by examiner

*Primary Examiner*—David Nelms
*Assistant Examiner*—Phuc T. Dang
(74) *Attorney, Agent, or Firm*—Thomas, Kayden, Horstemeyer & Risley

(57) ABSTRACT

A method for preventing horizontal and vertical crosstalk between conductive layers forms a dummy conductive layer between conductive layers and between conductive lines within a dielectric layer. The dummy conductive layer does not connect with conductive layers or conductive lines. Because the dummy conductive layer has a shielding effect for conductive layers, the method can reduce the horizontal and vertical crosstalk between conductive layers.

8 Claims, 4 Drawing Sheets

METHOD FOR PREVENTING CROSSTALK BETWEEN CONDUCTIVE LAYERS

BACKGROUND OF THE INVENTION

1. Field of the Invention

The present invention relates to a method for preventing crosstalk between conductive layers on a semiconductor device. More particularly, the present invention relates to a method for preventing horizontal and vertical crosstalk between conductive layers using a dummy conductive layer on a semiconductor substrate.

2. Description of the Related Art

As the integration density of semiconductor devices increases, more circuit elements must to be packed in a unit surface area of the device substrate, and circuit elements such as interconnects are necessarily increased between MOS transistors of the IC device. In many highly integrated semiconductor devices, more than two levels of interconnecting metal layers are demanded, called multilevel interconnects. Between these multiple metal layers, electrically insulating material known as inter-metal dielectrics are used to provide isolation in between the metal layers. Vias are formed in these inter-metal dielectric layers that can be filled with electrically conductive material to form plugs that provide electrical connection between the interconnects for different metal layers.

As shown in FIG. 1, planar conductive lines 108 are isolated by an inter-metal dielectric layer 104 on a substrate 100. Another conductive layer 110 is formed on the inter-metal dielectric layers 104. An inter-metal dielectric layer 106 is formed on the conductive layer 110. Another conductive layer 112 is formed on the inter-metal dielectric layer 106. The inter-metal dielectric layers 104 and 106 are formed to isolate the conductive layers 108, 110 and 112 and avoid any unwanted connection. In order to make interconnection between any of these conductive layers 108, 110 and 112, an interconnection structure is formed.

Multilevel interconnect structure includes conductive layers, conductive lines and plugs. The conductive lines are either located side by side and are isolated by inter-metal dielectric layer or else the conductive layers are located level by level and are connected by a plug. The planar conductive lines 108 and the conductive layer 110 are isolated by inter-metal dielectric layer 104, and the conductive layers 110 and 112 for different levels are isolated by inter-metal dielectric layer 106.

Semiconductor miniaturization results in reducing the distance between the interconnects. Electric fields are induced while charges flow through the interconnects. The distance between the conductive lines 108 is shorter than before, which induces electric field interference between the conductive lines 108 in a phenomenon known as horizontal crosstalk. Horizontal crosstalk can affect mobility of charges in the conductive lines 108, which reduces device performance. Similarly, the distances between the conductive lines 108 and the conductive layer 110 are shortened, which induces electric field interference between the conductive lines 108 and conductive layer 110 in a phenomenon known as vertical crosstalk. Vertical crosstalk can also affect mobility of charges in the conductive lines 108 and conductive layer 110, which reduces device performance.

Additionally, as the thickness of the inter-metal dielectric layers 104 between planar conductive lines 108 or between the conductive lines 108 and conductive layer 110 for different levels becomes thinner, an induced capacitance 114 becomes more obvious. The phenomenon is undesirable in the multilevel interconnects process.

SUMMARY OF THE INVENTION

Accordingly, the present invention provides a method for preventing horizontal and vertical crosstalk between conductive layers on a semiconductor device.

To achieve these and other advantages and in accordance with the purpose of the invention, as embodied and broadly described herein, the invention provides a method for preventing horizontal and vertical crosstalk between conductive layers on a semiconductor device to avoid device failure. A dielectric layer is formed on a substrate, and a plurality of conductive lines are formed on the dielectric layer, then an over etching step is performed on the exposed dielectric layer to form a recess thereon to expose the dielectric layer underlying the conductive lines. An insulation layer is deposited conformal to the substrate, the level of the insulation layer on the recess bottom is lower than that of the interface of the conductive layers and the dielectric layer. A dummy conductive layer is deposited on the insulation layer, wherein a portion of dummy conductive layers isolates the conductive lines to prevent horizontal crosstalk between the conductive lines.

This invention provides another method for preventing horizontal and vertical crosstalk between conductive layers. A dielectric layer is formed on a substrate and a first metallic layer and a second metallic layer are both formed within the dielectric layer, which first and second metallic layers are located on different levels and are isolated from each other by the dielectric layer. A via is formed between the first and the second metallic layers to connect them to each other and an insulation layer is formed around the via. A dummy conductive layer is formed between the first and the second metallic layers. The first metallic layer and the dummy conductive layer are isolated by the dielectric layer, the second metallic layer and the dummy conductive layer are also isolated by the dielectric layer, and the via and the dummy conductive layer are isolated by the insulation layer. The present method prevents vertical crosstalk between the first and the second metallic layers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
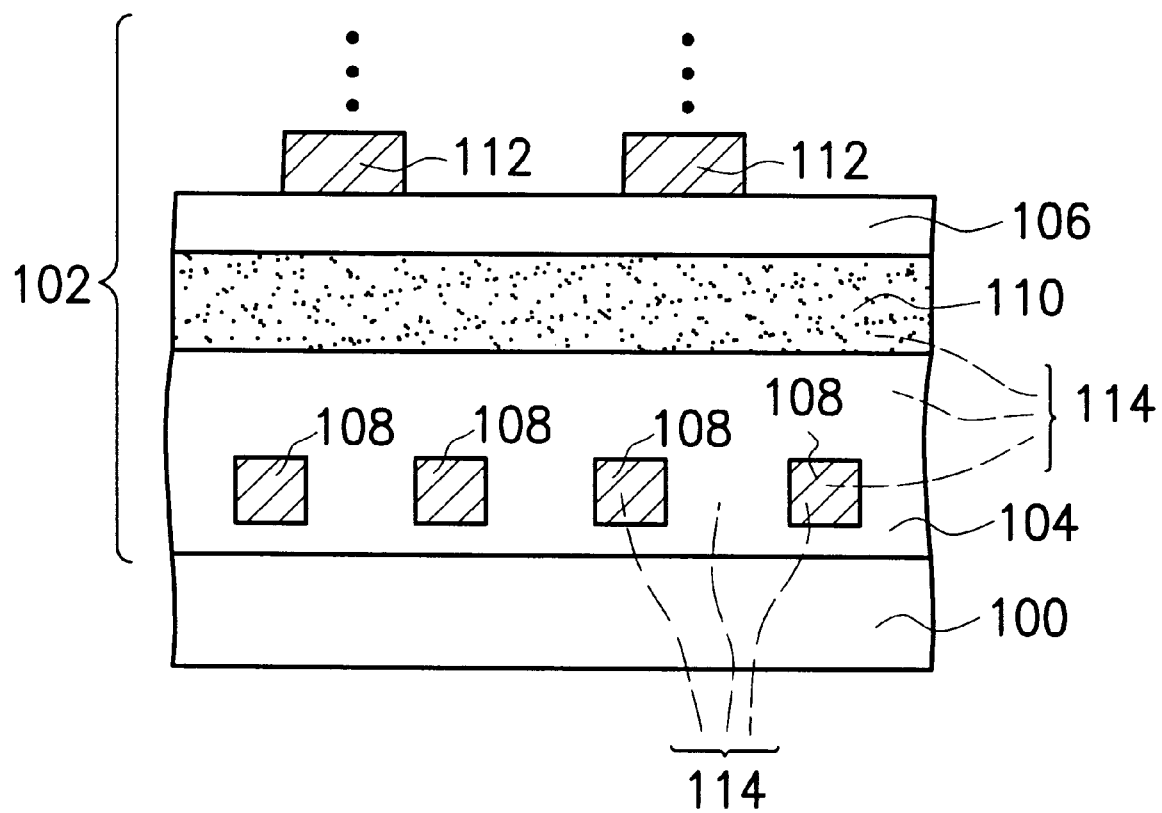
FIG. 1 is a schematic, cross-sectional view showing the structure of interconnects.

Reference will now be made in detail to the present preferred embodiments of the invention, examples of which are illustrated in the accompanying drawings. Wherever possible, the same reference numbers are used in the drawings and the description to refer to the same or like parts.

Semiconductor miniaturization results in reduced distance between interconnects; as a result, horizontal and vertical crosstalk between the metallic layers more seriously affects device performance. Thus, the present invention provides a method for forming a dummy conductive layer such as a metallic layer between the conductive lines to lower horizontal and vertical crosstalk.

Figure 2A:
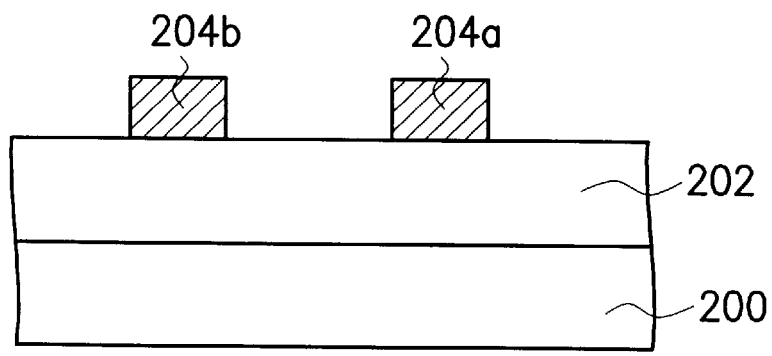
FIGS. 2A through 2C are schematic, cross-sectional views showing the method of manufacturing interconnects, which prevents horizontal crosstalk between conductive layers, in accordance with the preferred embodiment of the present invention.
Figure 2B:
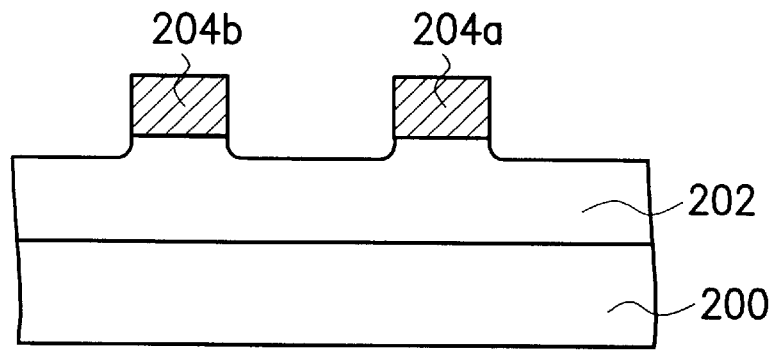
Figure 2C:
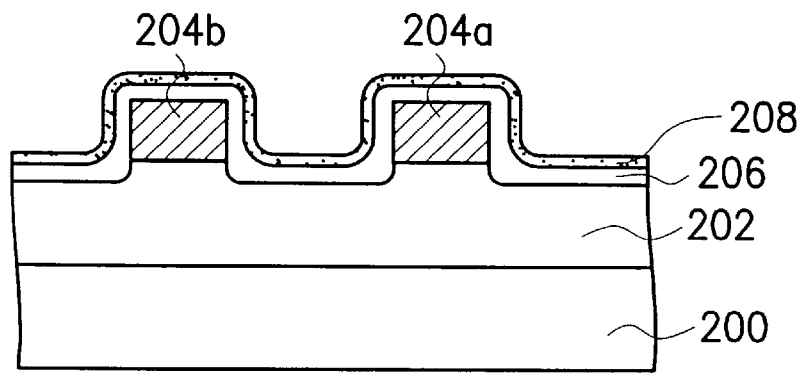

FIGS. 2A through 2C are schematic, cross-sectional views showing the method of manufacturing interconnects, which prevents horizontal crosstalk between conductive layers, in accordance with the preferred embodiment of the present invention. Referring to FIG. 2A, a dielectric layer 202 is deposited on a substrate 200 that includes a MOS device, etc. Conductive lines 204a and 204b such as interconnects are formed on the dielectric layer 202 such that a portion of the dielectric layer 202 remains exposed.

As shown in FIG. 2B, an over etching step is performed on the exposed dielectric layer 202 to form a recess to expose the dielectric layer 202 underlying the conductive lines 204a and 204b.

As shown in FIG. 2C, a thin insulation layer 206 is formed over the dielectric layer, the conductive lines 204a and 204b. The level of the insulation layer 206 at the recess bottom is lower than that of the interface of the conductive layers and dielectric layer. A dummy conductive layer 208 is deposited over the insulation layer 206, such as a metallic layer, and the thickness of the dummy conductive layer 208 must be enough to isolate adjacent conductive lines 204a and 204b. Because the dummy conductive layer 208 having a shielding effect is provided between the adjacent conductive lines 204a and 204b, the dummy conductive layer 208 can prevent horizontal crosstalk while charge flows in the conductive lines 204a and 204b.

Figure 3A:
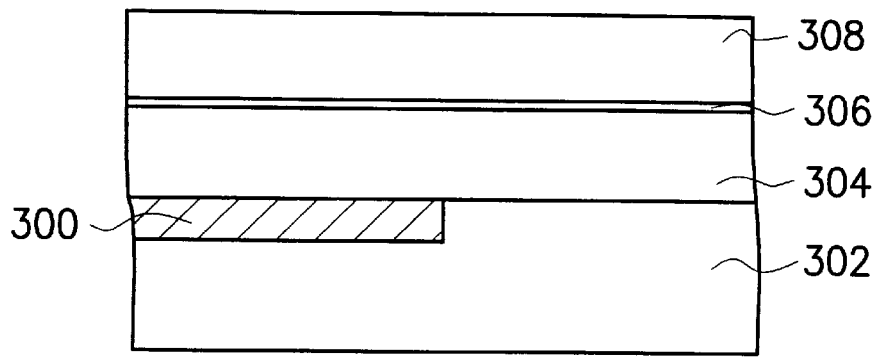
FIGS. 3A through 3C are schematic, cross-sectional views showing another method of manufacturing interconnects, which prevents vertical crosstalk between conductive layers located on different levels, in accordance with the preferred embodiment of present invention.
Figure 3B:
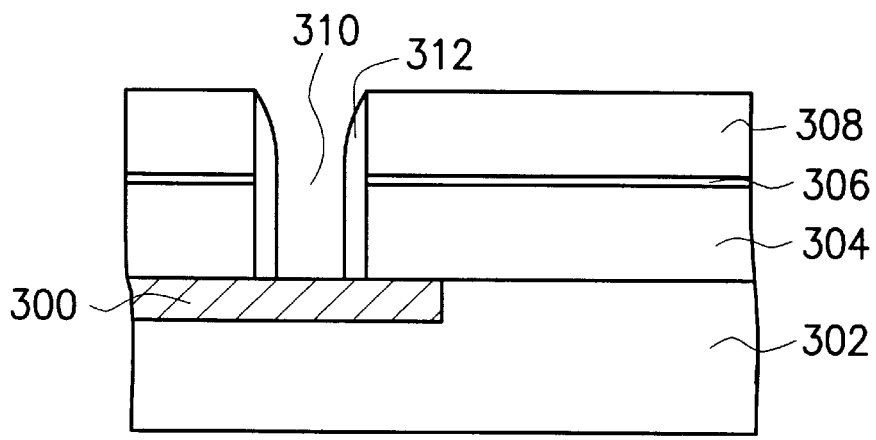
Figure 3C:
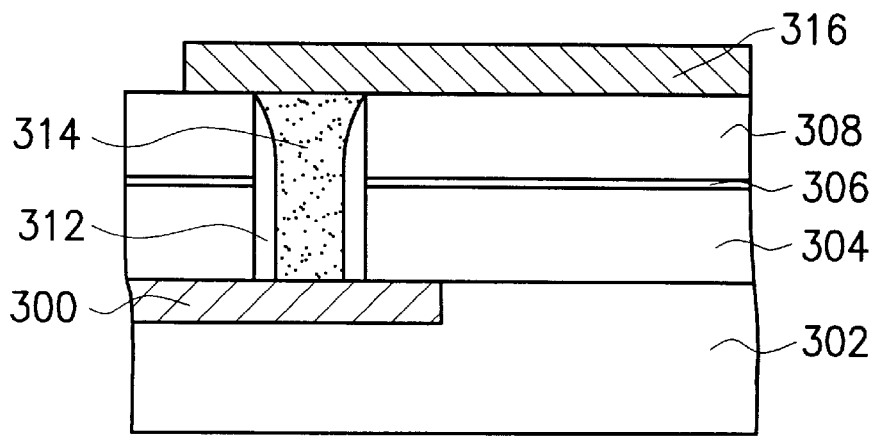

FIGS. 3A through 3C are schematic, cross-sectional views showing another method of manufacturing interconnects, which prevents vertical crosstalk between conductive layers located on different levels, in accordance with the preferred embodiment of the present invention. Referring to FIG. 3A, an inter-metal dielectric layer 304 is formed on a substrate 302 having a conductive layer 300, a dummy conductive layer 306 is formed on the inter-metal dielectric layer 304, and an inter-metal dielectric layer 308 is formed on the dummy conductive layer 306.

As shown in FIG. 3B, the inter-metal dielectric layer 308, the dummy conductive layer 306 and the inter-metal dielectric layer 304 are etched to form a via hole 310 by photolithography and etching until the conductive layer 300 is exposed. A spacer 312 is formed around the via hole 310, the spacer 312 material is an insulator such as silicon oxide. The via hole 310 is filled with conductive material to form a via and a via plug 314.

As shown in FIG. 3C, a conductive layer 316 is formed on the inter-metal dielectric layer 308 and on the via plug 314. The conductive layers 300 and 316 are connected by the via plug 314 to achieve electrical connection of both. Because the spacer 312 is formed around the via, the via plug 314 and the conductive layers are isolated by the spacer 312 to prevent short currents.

A dummy conductive layer 306 is provided between the conductive layers 300 and 316 in the invention. The dummy conductive layer 306 and the conductive layer 300 are isolated by the inter-metal dielectric layer 304, and the dummy conductive layer 306 and the conductive layer 316 are also isolated by the inter-metal dielectric layer 308. Because the dummy conductive layer 306 has a shielding effect, the invention can reduce vertical crosstalk between the conductive layers 300 and 316. The method of the invention also can be applied on other conductive layers besides the conductive layers 300 and 316 as described in this preferred embodiment according to the invention to prevent vertical crosstalk between conductive layers. The method can also prevent vertical crosstalk between a MOS gate and conductive layers, for example.

Figure 4:
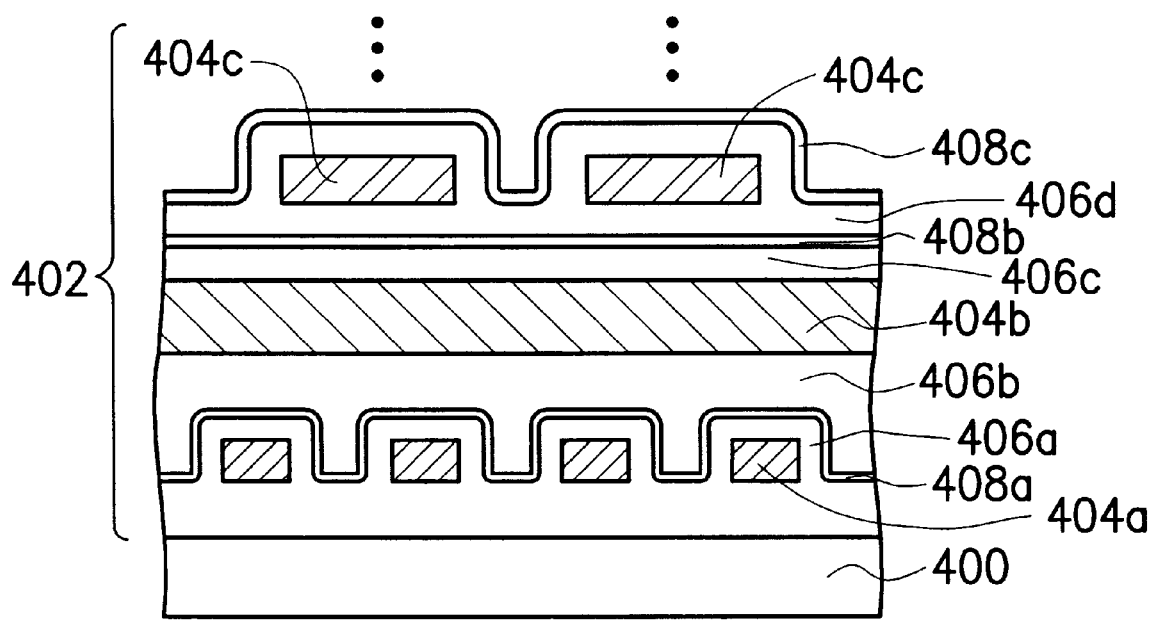
FIG. 4 is a schematic, cross-sectional view showing the structure for preventing horizontal and vertical crosstalk between conductive layers in accordance with the preferred embodiment of the present invention.

FIG. 4 shows one of the structures for preventing horizontal and vertical crosstalk between conductive layers in accordance with the preferred embodiment of the present invention. A structure of multilevel interconnects 402 is formed on a substrate 400, the structure of multilevel interconnects 402 includes conductive layers 404a, 404b and 404c, dielectric layers 406a, 406b, 406c and 406d, and dummy conductive layers 408a, 408b and 408 such as a metallic layer. The conductive layers 404a, 404b and 404c are isolated by the dielectric layers 406a, 406b, 406c and 406d, the dummy conductive layers 408a, 408b and 408c are formed between the dielectric layers 406a, 406b, 406c and 406d. Because the dummy conductive layers 408a, 408b and 408c have a shielding effect, the horizontal and vertical crosstalk between conductive layers 404a, 404b and 404c can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for preventing horizontal crosstalk between conductive layers on a semiconductor device, comprising the steps of:

providing a substrate having at least a first dielectric layer formed thereon;

forming a plurality of conductive lines on the first dielectric layer;

removing a portion of the exposed first dielectric layer to form a recess thereon to expose the first dielectric layer underlying the conductive lines;

forming an insulation layer on the substrate; and forming a dummy conductive layer on the insulation layer, a portion of the dummy conductive layer being located between the conductive lines;

forming a second dielectric layer over the substrate; and forming a patterned conductive layer on the second dielectric layer.

2. The method of claim 1, wherein the dummy conductive layer includes a metallic layer.

3. The method of claim 1, wherein the conductive lines include a defined metallic layer.

4. The method of claim 1, wherein the removing a portion of the first exposed dielectric layer step includes over-etching the dielectric layer.

5. A method for preventing vertical crosstalk between conductive layers, comprising the steps of:

forming a first dielectric layer on a substrate having at least a first conductive layer;

forming a dummy conductive layer on the first dielectric layer;

forming a second dielectric layer on the dummy conductive layer;

forming a via hole through the second dielectric layer, the dummy conductive layer and the first dielectric layer to expose the first conductive layer;

forming an insulation layer around the via hole;

forming a via plug in the via hole; and forming a second conductive layer on the second dielectric layer, wherein the second conductive layer connects with the first conductive layer by the via plug and is shielded from the first conductive layer by the dummy conductive layer.

6. The method of claim 5, wherein the first and the second conductive layers include a metallic layer.

7. The method of claim 5, wherein the dummy conductive layer includes a metallic layer.

8. A method for preventing vertical crosstalk between conductive layers, comprising the steps of:

forming a first dielectric layer on a substrate having at least a first conductive layer;

forming a dummy conductive layer on the first dielectric layer;

forming a second dielectric layer on the dummy conductive layer;

forming a via hole through the second dielectric layer, the dummy conductive layer and the first dielectric layer to expose the first conductive layer;

forming a spacer around the via hole;

forming a via plug in the via hole; and forming a second conductive layer on the second dielectric layer, wherein the second conductive layer connects with the first conductive layer by the via plug.

* * * * *